(12) United States Patent
Letowski et al.

(10) Patent No.: US 9,991,191 B2
(45) Date of Patent: Jun. 5, 2018

(54) ELECTRONIC POWER DEVICE WITH FLAT ELECTRONIC INTERCONNECTION STRUCTURE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Bastien Letowski, Grenoble (FR); Jean-Christophe Crebier, Bevenais (FR); Nicolas Rouger, Bandol (FR); Julie Widiez, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days. days.

(21) Appl. No.: 15/585,293

(22) Filed: May 3, 2017

(65) Prior Publication Data
US 2017/0323846 A1    Nov. 9, 2017

(30) Foreign Application Priority Data
May 4, 2016    (FR) ...................................... 16 54036

(51) Int. Cl.
*H01L 23/48*    (2006.01)
*H01L 23/367*    (2006.01)
(Continued)

(52) U.S. Cl.
CPC .... *H01L 23/49562* (2013.01); *H01L 23/3672* (2013.01); *H01L 23/49589* (2013.01); *H02M 7/537* (2013.01)

(58) Field of Classification Search
CPC ........... H01L 23/3735; H01L 23/49548; H01L 23/49589; H01L 23/49562; H01L 23/3675;
(Continued)

(56) References Cited

U.S. PATENT DOCUMENTS

| 9,214,399 B2 | 12/2015 | Cao et al. |
| 2004/0140474 A1* | 7/2004 | Ueda ................... H01L 33/0079 257/79 |

(Continued)

FOREIGN PATENT DOCUMENTS

| EP | 2 741 324 A1 | 6/2014 |
| JP | 2016-66700 | 4/2016 |
| WO | WO 2015/157845 A1 | 10/2015 |

OTHER PUBLICATIONS

French Preliminary Search Report dated Jan. 13, 2017 in French Application 16 54036 filed on May 4, 2016 (with English Translation of Categories of Cited Documents).
(Continued)

*Primary Examiner* — Jasmine Clark
(74) *Attorney, Agent, or Firm* — Oblon, McClelland, Maier & Neustadt, L.L.P.

(57) ABSTRACT

Electronic power device comprising:
an active layer comprising several lateral and/or semi-lateral components for which the electrodes are located on a front face of the active layer;
an interconnection structure comprising several conducting portions to which component electrodes are connected, and located in contact with these electrodes extending parallel to the active layer;
(Continued)

a support comprising a front face on which electrically conducting tracks are located, and in which:

the interconnection structure is located between the active layer and the support, the conducting portions being placed in contact with the conducting tracks, or the active layer is placed between the interconnection structure and the support, the conducting portions comprising parts extending next to the active layer and connected to the conducting tracks.

17 Claims, 6 Drawing Sheets

(51) Int. Cl.
  *H01L 23/495* (2006.01)
  *H02M 7/537* (2006.01)
(58) Field of Classification Search
  CPC .......... H01L 23/3677; H01L 23/49575; H01L 23/49582; H01L 23/3672; H02M 7/537
  See application file for complete search history.

(56) References Cited

U.S. PATENT DOCUMENTS

2013/0341776 A1  12/2013  Drobnik
2015/0173248 A1  6/2015  Zeng

OTHER PUBLICATIONS

B. Weiss et al., "Monolithically-Integrated Multilevel Inverter on Lateral GaN-on-Si Technology for High-Voltage Applications", 2015 IEEE Compound Semiconductor Integrated Circuit Symposium, 2015, pp. 4.

Kuntjoro Pinardi et al., "High-Power SOI Vertical DMOS Transistors With Lateral Drain Contacts: Process Developments, Characterization, and Modeling", IEEE Transactions on Electron Devices, vol. 51, No. 5, May 2004, pp. 7.

* cited by examiner

ELECTRONIC POWER DEVICE WITH FLAT ELECTRONIC INTERCONNECTION STRUCTURE

TECHNICAL DOMAIN AND PRIOR ART

The invention relates to the domain of power electronics, and more particularly to an electronic power device comprising lateral electronic power components, and a method of making such an electronic power device.

The domain of power electronics is following the same trend as microelectronics, with an increasing need for a reduction in the size and an improvement to performances of devices. Based on this principle, applications with more and more integrated functions are being developed, particularly for on-board systems, from electric vehicles to more electric aircraft, that have to satisfy increasingly strict reliability and reproducibility criteria and also to have the best possible cost/performance ratio.

In this context, electronic power components made with gallium nitride (GaN) epitaxied onto a silicon (Si) substrate are interesting because GaN provides good voltage withstand and good temperature stability of these components. Such components are compatible with CMOS type fabrication processes on silicon.

Figure 1:
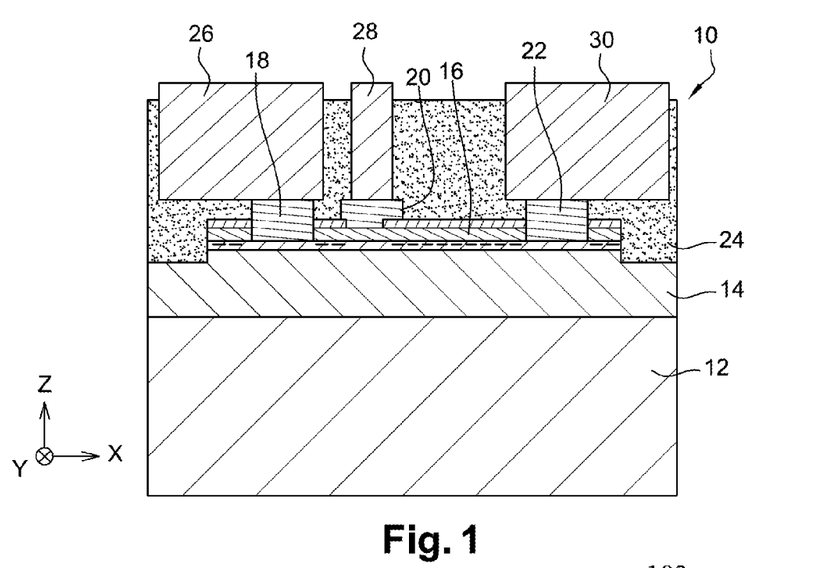
FIG. 1 shows an example embodiment of a lateral electronic power component.

An example embodiment of an electronic power component is shown in FIG. 1. On this figure, the component corresponds to a High Electron Mobility Transistor (HEMT) type power transistor 10, comprising GaN. This transistor 10 is made from a silicon substrate 12 that may for example be between about 725 μm and 1000 μm thick. The active part of the transistor 10 is formed from a GaN layer 14 on which an active layer 16 of AlGaN or AlN is formed in which the channel, source and drain regions of the transistor 10 are made. Electrodes 18, 20 and 22 respectively form the source, gate and drain electrodes respectively of the transistor 10. Metallic contacts 26, 28 and 30 that form electrical connections between the transistor 10 and other elements are also formed on these electrodes 18, 20, 22. These electrodes 18, 20, 22 and these metallic contacts 26, 28, 30 are electrically insulated from each other by a dielectric 24 formed around them. The sum of the thicknesses of layers 14 and 16 and electrodes 18, 20 and 22 is for example less than about 10 μm.

This type of electronic power component made from a GaN on silicon type substrate has a so-called "lateral" structure, in other words its electrodes are located on the same side corresponding to the front face of the component. This is also the case for electronic components made on an SOI (Silicon On Insulator) type substrate, for example of the LDMOS (Lateral Diffused MOS) type. In this type of lateral electronic power component, the electrical current circulates approximately parallel to the substrate from which this component is made, in other words in the (X, Y) plane in the case of the transistor 10 shown on FIG. 1.

Although these lateral electronic power components have very attractive characteristics for power applications, they required packaging optimised especially for EMC (Electro-Magnetic Compatibility) and for thermal aspects, partly to limit parasite inductances from loops because switching fronts of these transistors are very high. Furthermore, in such a component, all currents circulate in a very thin zone (a few μm thick, usually less than about 10 μm). Therefore the power density to be evacuated from these components is high and high performance packaging is necessary to evacuate heat from small dimensions.

Furthermore, in a GaN on silicon type lateral electronic power component such as the transistor 10 described above, the substrate 12 arranged on the back face of the component is a problem for the cooling of the component that is done from the back face of the component since the substrate 12 is thick and the conductivity of silicon is low (148 W·m$^{-1}$·K$^{-1}$) compared with other semiconducting materials used in power electronics, for example such as silicon carbide (about 500 W·m$^{-1}$·K$^{-1}$).

Similar problems also arise for electronic power components with a so-called "semi-lateral" or "semi-vertical" structure such as Double-Diffused Metal-Oxide-Semiconductor (DMOS) transistors. In such a component, all electrodes are located on the same face that is the front face of the component. One of the electrodes (source or drain) is also present in depth in the component, thus conferring a vertical voltage withstand on the component. Therefore current in such a component circulates vertically and horizontally, in other words approximately parallel to and perpendicular to the substrate from which this component is made.

Most electronic power components comprising GaN are designed and manufactured collectively. They are then cut (thus isolating the components) and assembled into chips and are designed to be used independently, but unfortunately this makes it impossible to benefit from the real performances made possible using the GaN technology.

The monolithic approach that consists of making components of an electronic power device collectively from the same substrate rather than assembling previously cut out components or made using different technologies, shows up an answer to a need, a specific application in which electrical and thermomechanical performances and robustness are better than in chip by chip approaches.

The document B. Weiss et al., <<Monolithically-Integrated Multilevel Inverter on Lateral GaN-on-Si Technology for High-Voltage Applications>>, 2015 IEEE Compound Semiconductor Integrated Circuit Symposium (CSICS), 2015, pp. 1-4, describes manufacturing of a monolithic multilevel converter in which components and interconnection pads are designed in the context of a power converter. In this device, components that will be electrically connected to each other are positioned side by side on the substrate so that a conducting track located on the substrate makes these electrical connections. The connection pads of these components are connected to pads of external connections by wire bonding.

However, the packaging proposed in this document that uses a plane structure and conducting wires, strongly limits the electrical and thermal performances that can be obtained.

Document WO 2015/157845 A1 describes a packaging of a GaN electronic power component in which the electrodes are brought onto a back face of the packaging, which is located on the side of the back face of the component, through copper micro-vias perforated by laser. There is a thermal pad on the side of the front face of the packaging to facilitate heat dissipation, on the front face of the component. Thus, good cooling is obtained because the thermal pad is located on the front face of the component.

However, this packaging is only adapted to individual electronic power components and not to electronic devices comprising several electronic components.

PRESENTATION OF THE INVENTION

Thus there is a need to propose a new type of electronic power device with lateral electronic power components in which the thermal dissipation of heat generated by lateral electronic power components is improved, while guaranteeing a high performance electrical interconnection between these components and minimisation of these electromagnetic disturbances within the device.

To achieve this, one embodiment discloses an electronic power device comprising at least:

an active layer comprising at least one semiconductor and in which several lateral and/or semi-lateral electronic power components (that is several lateral electronic power components, or several semi-lateral electronic power components, or several lateral and semi-lateral electronic power components) are made, all electrodes of the electronic power components being located on a front face of the active layer;

an electrical interconnection structure comprising several electrically conducting portions secured to the front face of the active layer, to which the electrodes of the electronic power components are electrically connected, and of which at least first parts placed in contact with the electrodes of the electronic power components extend in a plane approximately parallel to the active layer;

a support comprising a front face on which electrically conducting tracks, or strips, are located, and in which the active layer and the electrical interconnection structure are secured to the front face of the support such that:

the electrical interconnection structure is located between the active layer and the support, the first parts of the electrically conducting portions being placed in contact with the electrically conducting tracks, or the active layer is located between the electrical interconnection structure and the support, the electrically conducting portions also comprising second parts extending next to the active layer and electrically connecting the first parts of the electrically conducting portions to the electrically conducting tracks.

Such an electronic power device comprises an electrical interconnection structure of which at least part is located against the front face of the active layer forming a flat, or plane, structure. Due to this flat structure, it is possible to locate the electronic power components on the support such that the electrical interconnection structure is located between the active layer and the support and in contact with the electrically conducting tracks located on the support. In this configuration, the support then forms a heat transfer element capable of efficiently dissipating heat generated by electronic power components on the front face of the active layer.

Such thermal dissipation of heat generated by the electronic components is not possible when connection wires are used to electrically connect the electronic components to the metallizations of the support on which the electronic power components are located.

In another configuration, the active layer is located between the electrical interconnection structure and the support. In this case, the first parts of the electrically conducting portions of the electrical interconnection structure form a flat structure on which a heat sink can be mounted to achieve good thermal dissipation of heat from the front face of electronic power components. Another advantage of this configuration is that it enables separation of electrical and thermal propagation pathways in the device, in other words optimum decoupling between electromagnetic and thermal magnitudes within the device.

Thus, in these two configurations, the flat structure formed by the electrically conducting portions of the electrical interconnection structure enable the combination of good electrical conduction and good thermal conduction, solving the problem that arises in power devices according to prior art.

Furthermore, the structure of the electronic power device is such that the device may comprise several electronic power components, the thermal dissipation obtained due to the flat structure of the electrical interconnection structure being applicable to these different electronic power components.

Finally, such an interconnection structure can reduce electromagnetic disturbances generated within the device, particularly parasite inductances of loops or switching meshes, compared with technologies making use of flat cable type connections or wires.

Another advantage of such an electronic power device is that it can be designed and made using collective processes by which several devices can be reliably manufactured simultaneously.

The plane approximately parallel to the active layer corresponds to a plane approximately parallel to the principal faces of the active layer that are the faces of the active layer with the largest dimensions (for example the largest diameter). Thus, in the transistor 10 described above with reference to FIG. 1, this plane approximately parallel to the active layer 16 is parallel to the (X,Y) plane.

When the electrically conducting portions comprise second parts extending next to the active layer, these second parts are not arranged above the active layer but extend laterally on the side of it.

The expression "active layer" may denote a single continuous layer of material on which several electronic power components are made collectively. This expression also refers to several portions of semiconducting material in which one or several electronic power components are made and that, when they are secured to the electrical interconnection structure at their front face, are located adjacent to each other and together form this active layer. Thus, the electronic power components of the electronic power device may or may not be made collectively, in other words from the same substrate or from different substrates.

Advantageously, the electrodes of the lateral and/or semi-lateral electronic power components are flat, e.g. totally flat, and may extend in a plane approximately parallel to the active layer. Thus the flat structure formed by the electrical interconnection structure may contact directly the flat electrodes. It is not necessary to control the spaces between the electrodes and the electrical interconnection structure.

Advantageously, the electronic power components may be made according to a monolithic approach, that is made collectively from the same substrate.

Advantageously, and particularly when the interconnection structure is located between the active layer and the support, the support may comprise at least one material with thermal conductivity of more than about 148 W·m$^{-1}$·K$^{-1}$.

The thickness of the electrically conducting portions may be between about 50 μm and 1000 μm. Thus, the electrically conducting portions can also mechanically retain electronic power components. For example, when these components are made from a substrate comprising a support layer with a thickness typically more than 200 μm (for example like substrate 12 for the transistor 10 described above with reference to FIG. 1) mechanically retaining the components, such an electrical interconnection structure can be secured, or attached, to the electronic power components, advantageously at the scale of the wafer (in other words for components designed to form part of several electronic power devices, in this case with the electrical interconnection structure that for example corresponds to a part of a structured metallic layer), then the thick support layer of the substrate can be eliminated before the electronic power components are assembled on the support of the device.

Furthermore, such a thickness of electrically conducting portions is conducive to obtaining both very good electrical conduction and very good thermal conduction.

At least the first parts of electrically conducting portions may form rectangular parallelepipeds. These rectangular parallelepipeds may advantageously be oriented approximately parallel to each other. However, a different arrangement of the electrically conducting portions of the interconnection structure is quite possible.

The electronic power device may also comprise at least one heat sink when the active layer is located between the electrical interconnection structure and the support, located on the electrical interconnection structure such that the electrical interconnection structure is located between the at least one heat sink and the active layer. Thus, heat generated from the front face of lateral electronic power components is favourably evacuated through the electrical interconnection structure and this heat sink. When the heat sink comprises an electrically conducting material, a dielectric layer may be inserted between the heat sink and the electrical interconnection structure. A dielectric may be provided between the heat sink and the electrical interconnection structure to prevent a short circuit between the different elements of the electrical interconnection structure.

The electronic power device may also comprise at least one decoupling capacitor such that:
  when the electrical interconnection structure is located between the active layer and the support, said at least one decoupling capacitor is placed on a part of the electrically conducting tracks and is electrically connected to the electrically conducting tracks, or
  when the active layer is located between the electrical interconnection structure and the support, said at least one decoupling capacitor is placed on the second parts of the electrically conducting portions and is electrically connected to the second parts of the electrically conducting portions, or is placed on the first parts of the electrically conducting portions.

Thus, the decoupling capacitor(s) are placed as close as possible to the electronic power components. Therefore this arrangement of the decoupling capacitor(s) enables capacitive decoupling as close to electronic power components as possible, minimising interconnections between these components and this or these capacitors. This or these decoupling capacitors can also filter differential mode disturbances generated by switching inside the device, as close to the source of these disturbances as possible, thus reducing the current circulation mesh between the capacitor(s) and the electronic power components.

However, it is also possible that the decoupling capacitor(s) should be located on the support adjacent to the electrically conducting tracks, in this case with additional electrical connection elements electrically connecting this or these decoupling capacitors to the electrical interconnection structure.

When the active layer is located between the electric interconnection structure and the support and said at least one decoupling capacitor is located on the first parts of the electrically conducting portions, the heat sink may be located on said at least one decoupling capacitor. In this configuration, the decoupling capacitor(s) form an additional layer increasing the thermal resistance between the active zone of the electronic power components and ambient air.

When the active layer is located between the electric interconnection structure and the support, said electronic power device may also comprise at least one first metallic layer located between the support and the active layer and onto which a first electrical power supply potential of the electronic power device is intended to be applied and/or, when the electronic power device comprises at least one heat sink located on the electrical interconnection structure, at least one second metallic layer located between the heat sink and the electrical interconnection structure and onto which a second electrical power supply potential of the electronic power device is intended to be applied.

These first and second metallic layers thus form electrostatic screens interposed between the electrical interconnection structure and the support and between the electrical interconnection structure and the heat sink. These electrostatic screens increase the distance between the electrical interconnection structure and the support and the heat sink, and reduce common mode parasite capacitances because disturbing electrical potentials (corresponding to output signals from the electronic power device) are confined by the electrical power supply potentials applied on these metallic layers. Dielectric layers may be present on and/or under these metallic layers to prevent short circuits that could be created within the electronic device due to these metallic layers.

The electronic power device may be such that:
  the active layer comprises at least GaN and/or AlGaN and/or AlN, and/or the components comprise HEMT type transistors, or
  the active layer comprises at least silicon, and/or the components comprise MOS and/or JFET (Junction Field Effect Transistor) and/or IGBT (Insulated Gate Bipolar Transistor) and/or BJT (Bipolar Junction Transistor) and/or DMOS type transistors.

At least some of these electronic power components may form at least one switching cell, and/or the electronic power device may comprise at least one static converter comprising several switching cells electrically connected to each other.

Thus, the electronic power device may comprise a static converter such as an inverter, a chopper, a rectifier or a dimmer, and/or a polyphased converter such as an interlaced chopper and/or an association of switching cells and power transistors in series, in the case of a multilevel inverter.

The electronic power components may be located on at least one semiconducting substrate such that:
  when the electrical interconnection structure is located between the active layer and the support, the active layer is located between the semiconducting substrate and the electrical interconnection structure, or
  when the active layer is located between the electrical interconnection structure and the support, the semiconducting substrate is located between the active layer and the support.

However, such a semiconducting substrate that can be present during manufacturing of electronic power components can be advantageously eliminated during manufacturing of the electronic power component. Thus, when the electrical interconnection structure is located between the active layer and the support, the back face of the active layer is then no longer covered by such a semiconducting substrate. When the active layer is located between the electrical interconnection structure and the support, such a semiconducting substrate is no longer present between the active layer and the support. Eliminating this substrate results in better optimisation of the voltage withstand and performances of components.

It is also proposed a method of making an electronic power device comprising at least implementation of the following steps:
make several lateral and/or semi-lateral electronic power components in at least one active layer comprising at least one semiconductor such that all electrodes of the electronic power components are located on a front face of the active layer;
attachment of the front face of the active layer to an electrical interconnection structure comprising several electrically conducting portions to which the electrodes of the electronic power components are electrically connected, and of which at least first parts located in contact with the electrodes of the electronic power components extend in a plane approximately parallel to the active layer;
attachment of the active layer and the electrical interconnection structure to a front face of a support on which electrically conducting tracks extend, such that:
the electrical interconnection structure is located between the active layer and the support, the first parts of the electrically conducting portions being located in contact with the electrically conducting tracks, or
the active layer is placed between the electrical interconnection structure and the support, the electrically conducting portions comprising second parts extending next to the active layer and electrically connecting the first parts to the electrically conducting tracks.

In particular, such a method is compatible with a collective implementation on the scale of the substrate, making several electronic power devices simultaneously.

Furthermore, this method may also use bonding and assembly techniques to maximise thermal and electrical characteristics of the interface between the semiconductor and the conductors.

It is possible that the electronic power components are made from different substrates. In this case, the components are cut out and then attached, or secured, at their front face to the electrical interconnection structure. Active parts of these components that are then located adjacent to each other together form the active layer.

Advantageously, the electronic components are made collectively from a single continuous semiconducting active layer. In this case, when the electrical interconnection structure is located between the active layer and the support:
the electronic power components may be made collectively in the active layer that is located on a semiconducting substrate,
the attachment of the front face of the active layer to the electrical interconnection structure may correspond to an attachment of the front face of the active layer to a structured metallic layer that is intended to form the electrical interconnection structure.

Thus electrical interconnection structures of several electronic power devices composed of components made from the same substrate may be made collectively at the scale of the substrate.

In this case, the method may also include a step to eliminate the semiconducting substrate between attachment of the front face of the active layer to the structured metallic layer and attachment of the active layer and the electrical interconnection structure to the front face of the support. In this case, the structured metallic layer is used as a mechanical support structure when the semiconducting substrate is eliminated.

Furthermore, the method may also include a step to cut out at least the active layer and the structured metallic layer between the attachment of the front face of the active layer to the structured metallic layer and the attachment of the active layer and the electrical interconnection structure to the front face of the support, forming a stack that is then transferred to the front face of the support. This cut may form individual chips corresponding to electronic power devices that are then transferred onto the support.

As a variant, the active layer is located between the electrical interconnection structure and the support.
the electronic power components may be made collectively in the active layer that is located on a semiconducting substrate,
the active layer may be secured to the front face of the support before the electrical interconnection structure is secured with the front face of the active layer,
and the method may also include a step to cut the semiconducting substrate and the active layer between the making of the electronic power components and the attachment of the active layer to the front face of the support, forming a stack that is then transferred to the front face of the support.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 2:
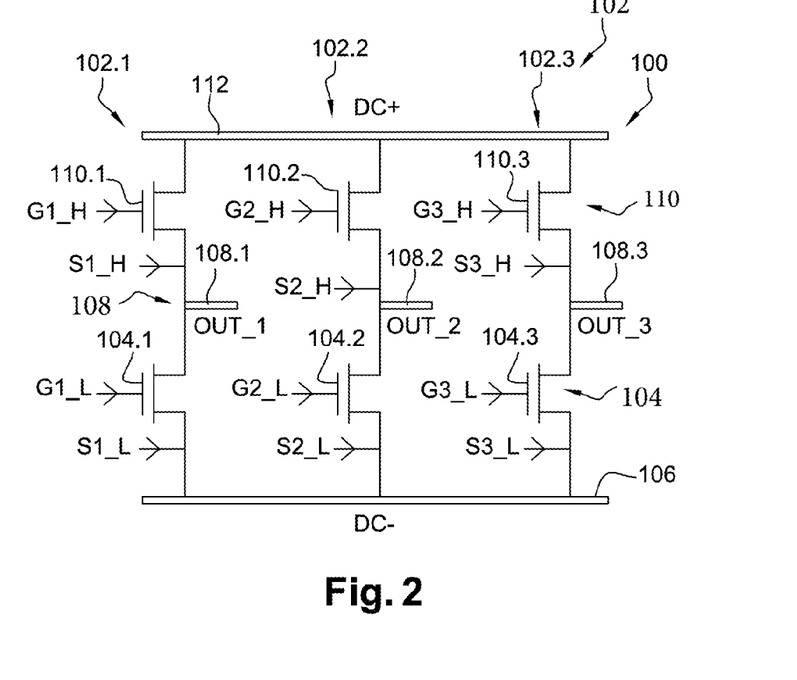
FIG. 2 shows the electrical schematic for an electronic power device according to this invention, corresponding to a static converter.

FIG. 2 shows the electrical schematic for an example embodiment of an electronic power device 100 corresponding to a static converter. For example, this static converter may be an inverter or a polyphased chopper, in this case three-phase, comprising three switching cells 102 (each cell forming one arm of the static converter), with references 102.1, 102.2 and 102.3 respectively on FIG. 2, and used for example for the power supply and control of AC rotating machines, three-phase motors, etc.

Each arm of the converter comprises at least two lateral and/or semi-lateral electronic power components, for example with a structure similar to the structure of the transistor 10 previously described with reference to FIG. 1.

The lateral electronic power components of the device 100 may for example be made using a silicon on insulator (SOI) technology and for example correspond to MOS type transistors, particularly LDMOS, JFET, IGBT or BJT type transistors or DMOS transistors, or are advantageously made with GaN, for example HEMT type transistors, for example with a structure similar to the structure of the previously described transistor 10. For electronic components that require voltage withstands higher than about 100 V or even higher than about 200 V, it is also possible to make the electronic power components of the device 100 using so-called semi-vertical technologies such as DMOS transistors. The structure of such transistors is described for example in the document by K. Pinardi et al., entitled "High-Power SOI Vertical DMOS Transistors With Lateral Drain Contacts: Process Developments, Characterization, and Modeling", IEEE Transactions on Electron Devices, vol. 51, No. 5, May 2004.

In general, the lateral electronic power components of the device 100 may be transistors and/or thyristors and/or antiparallel diodes and/or rectifier diodes.

On the example in FIG. 2, each of the switching cells 102 comprises a first power transistor 104 (referenced 104.1, 104.2 and 104.3 for each of the cells 102.1, 102.2 and 102.3), the drain of which is connected to a first electrically conducting element 106 that is common to the three switching cells 102 and on which a first DC-electrical power supply potential is applied, for example corresponding to the ground. The source of each of the first transistors 104 is connected to a second electrically conducting element 108 (referenced 108.1, 108.2, 108.3 for each of the cells 102.1, 102.2 and 102.3) on which output signals named OUT_1, OUT_2 and OUT_3 of each of the switching cells 102 are retrieved.

Each of the switching cells 102 also comprises a second power transistor 110 (referenced 110.1, 110.2 and 110.3 for each of the cells 102.1, 102.2 and 102.3), the drain of which is connected to a third electrically conducting element 112 that is common to the three switching cells 102 and on which a second DC+ electrical power supply potential is applied, in this case corresponding to the positive electrical potential of the power supply. The source of each of the second transistors 110 is connected to one of the second elements 108.

It is possible that the source and the drain of each of the transistors 104 and 110 are connected to each other through an antiparallel power diode (not shown on FIG. 2). These antiparallel diodes can be integrated into the transistors, or they may correspond to distinct components of transistors.

The transistor gates 104 and 110 are connected to a control system or driver, not shown on FIG. 2, capable of controlling switching of the cells 102 of the device 100 through the application of signals G1_H; G2_H, G3_H, G1_L, G2_L and G3_L onto these gates.

Figure 3:
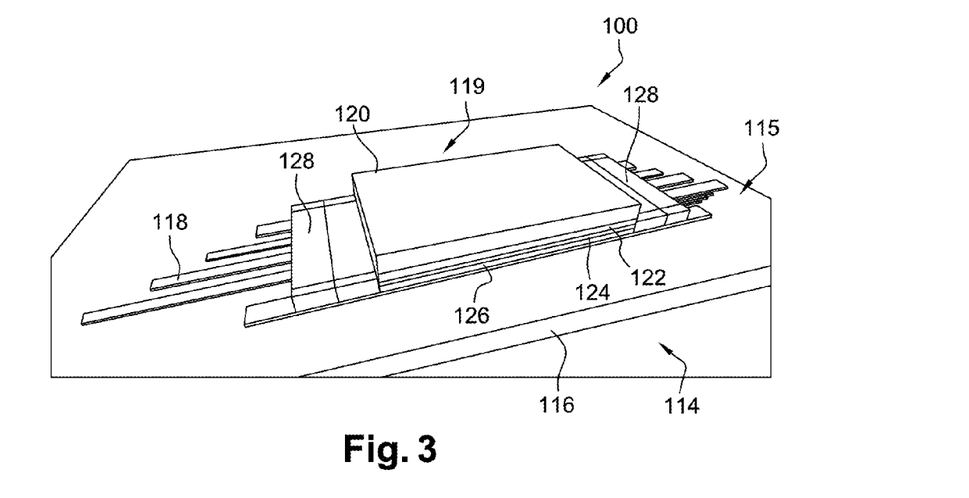
FIG. 3 diagrammatically shows a first embodiment of an electronic power device according to this invention.

FIG. 3 shows a first embodiment of the device 100.

The device 100 comprises a support 114 of the PCB (Printed Circuit Board) type or corresponding to a Direct Bond Copper (DBC) substrate, in other words that comprises a metallised ceramic layer. The support 114 comprises a dielectric layer 116, for example corresponding to an epoxy layer in the case of a PCB type support 114 or a ceramic layer in the case of a DBC type support 114. The support 114 also comprises electrically conducting tracks 118, or metallizations, for example comprising copper, located on a front face 115 of the layer 116.

The device 100 also comprises an electronic power module 119 comprising the lateral electronic power components forming the previously described switching cells 102, and therefore forming switching elements of the static converter.

In the first embodiment shown on FIG. 3, the power electronic components are GaN on silicon type lateral components and their structure is similar to the structure of the transistor 10 described above with reference to FIG. 1. For example, the components may be made collectively from the same GaN on silicon type substrate comprising a silicon substrate or support layer 120 (similar to the substrate 12), a GaN layer 122 (similar to layer 14) and an active layer 124 of AlGaN or AlN or GaN (similar to layer 16) in which the active parts of components (channel source and drain regions for transistors) are made. Electrodes (not shown on FIG. 3) are made on the front face of the active layer 124, and in this case form the source, gate and drain electrodes of the transistors 104, 110. Metallic contacts similar to contacts 26, 28 and 30 of the transistor 10 are made on the electrodes of each transistor 104, 110.

The electronic power components may be such that:
the active layer 124 comprises at least GaN and/or AlGaN and/or AlN, and/or the lateral electronic power components comprise HEMT type transistors, or
the active layer 124 comprises at least silicon, and/or the lateral electronic power components comprise MOS and/or JFET and/or IGBT and/or BJT and/or DMOS type transistors.

The material(s) of the layers 122, 124 and the substrate 120 are chosen as a function of the manufacturing technology of lateral electronic power components of the device 100.

The module 119 also comprises an electrical interconnection structure 126, for example made in the form of a metal "Lead Frame" for example including copper. The structure 126 comprises several discontinuous electrically conducting portions electrically connecting the electronic power components forming switching cells 102 to each other. These conducting portions form rectangular parallelepipeds oriented approximately parallel to each other, and extending parallel to the front face 115 of the layer 116 of the support 114. These electrically conducting portions in this case extend parallel to the electrically conducting tracks 118. In the example embodiment described herein, three of the electrically conducting portions of the structure 126 form mid-points of the switching cells 102 and the output terminals of these switching cells 102, and correspond to the second conducting elements 108.1, 108.2, 108.3 previously described with reference to FIG. 2. Six other electrically conducting portions of the structure 126 are each connected to one of the gates of transistors 104 and 110. Finally, two other electrically conducting portions of the structure 126 correspond to the conducting elements 106 and 112 described above with reference to FIG. 2.

The electrically conducting portions of the structure 126 are in contact with the electrodes (through metallic contacts mounted above the electrodes) of the electronic power components located on the front face of these components. The electrical connections of the static converter previously described with reference to FIG. 2 are obtained by putting each electrically conducting portion of the structure 126 in contact with either a single electrode (for portions in contact with gate electrodes) or with two electrodes (for portions forming the second conducting elements 108) or with three electrodes (for portions forming the conducting elements 106 and 112).

The attachment that electrically connects the metallic contacts of these components to the electrically conducting portions of the structure 126 is done for example by copper-copper bonding when the electrically conducting portions and the metallic contacts contain copper.

As a variant, it is possible for the transistors 104, 110 to be made separately from each other, in others non-collectively, and that these transistors are individually secured to the structure 126.

The module 119 is transferred onto the front face 115 of the layer 116 such that the electrically conducting portions of the structure 126 are located in contact with the electrically conducting tracks 118 and are electrically connected to these tracks 118. This transfer can be made by a flip-chip type method or by soldering.

Since the front faces of the electronic power components, in this case the transistors 104 and 110, are located in contact with the support 104 through the structure 126, and since heat is generated by these components at their front face, good heat evacuation is obtained through the support 114, through the electrical interconnection structure 126 that forms a good heat dissipation element.

This configuration is also advantageous because it makes it possible to place other electronic components, and particularly passive components, as close as possible to power components forming the converter. Thus, in the example in FIG. 3, two decoupling capacitors 128 are placed on the support 114, close to the lateral faces of the module 119. In this case, these capacitors 128 are of the "Surface Mounted Device" (SMD) type and are soldered directly onto the conducting tracks. In the example described herein, each capacitor 128 comprises two electrodes each electrically connected to one of the tracks 118 corresponding to one of the two conducting elements 106, 112. As a variant, these capacitors 128 can be placed on the support 114 adjacent to the tracks 118, in this case with additional electrical connecting elements to connect them electrically to the module 119.

With such a structure, the capacitors 128 filter differential mode disturbances generated by switching of components, in this case transistors, switching cells 102, this filtering being done as close to these components and therefore to the source of these disturbances as possible. Therefore the current circulation mesh between the capacitors 128 and the components forming the switching cells is minimised, which reduces differential mode disturbances within the device 100.

The device 100 also comprises a control circuit or driver, not shown on FIG. 3, capable of controlling switching of cells 102 and that is transferred on the front face 115 of the layer 116 of the support 114. This circuit may include low voltage electronic components, for example CMOS transistors. This control circuit is connected to the gates of transistors 104, 110 through tracks 118.

The device 100 can also include other electronic components, for example passive elements such as one or several inductances located on the front face 115 of the layer 116 of the support 114.

In the example described above, the device 100 comprises switching cells 102, each composed of two power transistors, each of which can be optionally coupled to an antiparallel diode. These two transistors may be of complementary types (N and P) or the same type.

A switching cell comprises at least two switches operating in a complementary manner, each switch may be controllable (such as a transistor or a thyristor) or non-controllable (power diode). Each of the two switches of the switching cell may correspond to a controlled switch coupled to an antiparallel diode.

Figure 4:
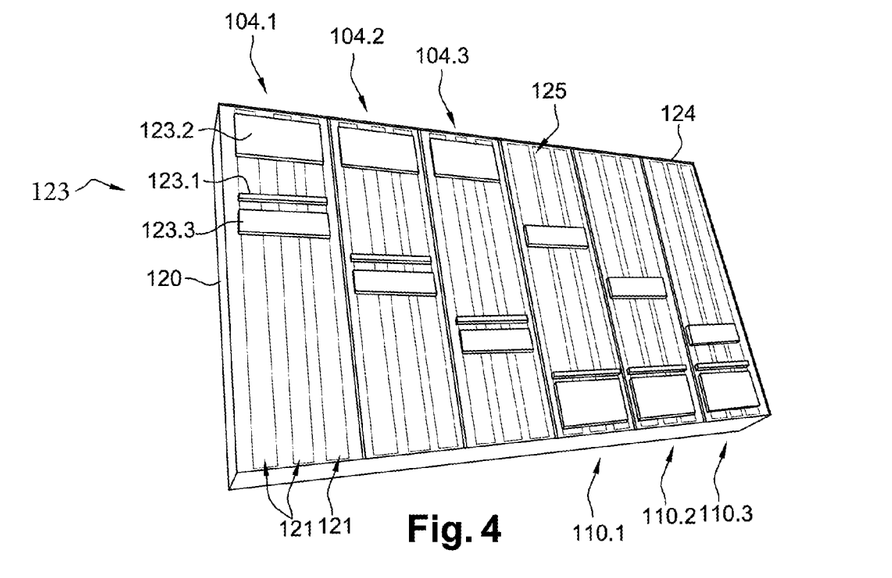
FIG. 4 diagrammatically shows one example embodiment of the electrodes of lateral electronic power components of an electronic power device according to this invention.

FIG. 4 diagrammatically shows the metal contacts 123 of transistors 104 and 110 that are present on the front face 125 of the active layer 124 and that will be secured to the electrical interconnection structure 126. Each of the transistors 104.1-104.3 and 110.1-110.3 comprises three metallic contacts: a first contact 123.1 connected to the transistor gate electrode, a second contact 123.2 connected to the transistor drain electrode and a third contact 123.3 connected to the transistor source electrode. In this case the electrodes 121 of each of the transistors 104 and 110 are made in the form of interdigitated fingers which enables optimum use of the entire semiconducting surface of the active layer for each of the transistors 104, 110.

The electrical connections between these contacts 123 of the different transistors 104, 110 are made by attaching the electrically conducting portions of the structure 126 in contact with these metallic contacts.

Figure 5:
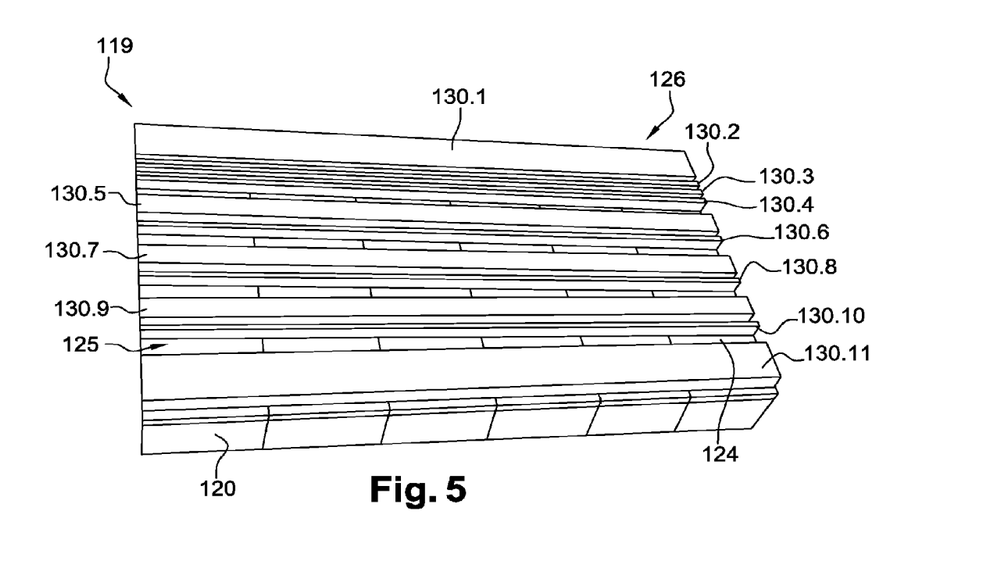
FIG. 5 diagrammatically shows one example embodiment of an electronic module forming part of an electronic power device according to this invention.

FIG. 5 diagrammatically shows the module 119 obtained when the electrical interconnection structure 126 is secured in contact with these metallic contacts 123. On this example, the structure 126 comprises eleven electrically conducting portions 130, referenced 130.1-130.11 on FIG. 5, forming rectangular parallelepipeds approximately parallel to each other, with a thickness (corresponding to the dimension perpendicular to the front face of the active layer 124) in this case equal to between about 50 μm and 1000 μm.

In the example described herein, the portion 130.1 forms the first electrically conducting element 106. Each of the portions 130.2-130.4 is connected to a metallic contact located on a gate electrode of transistors 104.1-104.3. Each of the portions 130.6, 130.8 and 130.10 is connected to a metallic contact located on a gate electrode of transistors 110.1-110.3. Each of the portions 130.5, 130.7 and 130.9 form one of the second electrically conducting elements 108.1-108.3. The portion 130.11 forms the third electrically conducting element 112.

The electrically conducting portions 130 extend in a plane approximately parallel to the active layer 124, facilitating bringing the structure 126 into contact with the conducting tracks 118.

Several modules 119 can be made collectively on the scale of the wafer. In this case, the lateral electronic power components of several electronic power devices are made from the same substrate, and then a structured metallic layer that will form the electrical interconnection structures 126 of these modules is secured to the component electrodes. The assembly obtained is then cut into component isolation zones to form different modules 119 that are then transferred onto the support 114.

The structured metallic layer may for example be made by machining a metallic disk, in this a copper disk, with a diameter equal to at least the diameter of the wafers used to make the electronic power components, and with a thickness equal for example to about 300 µm, according to patterns to form electrically conducting portions 130 and therefore according to the necessary connections between the components. For example, this machining forms rectangular shaped recesses through the metallic layer, thus forming conducting portions 130 in the form of rectangular parallelepipeds.

For example, the structured metallic layer may be secured to the tracks 118 by wafer to wafer assembly by metallic thermocompression bonding or direct bonding, for example copper-copper bonding.

Figure 6:
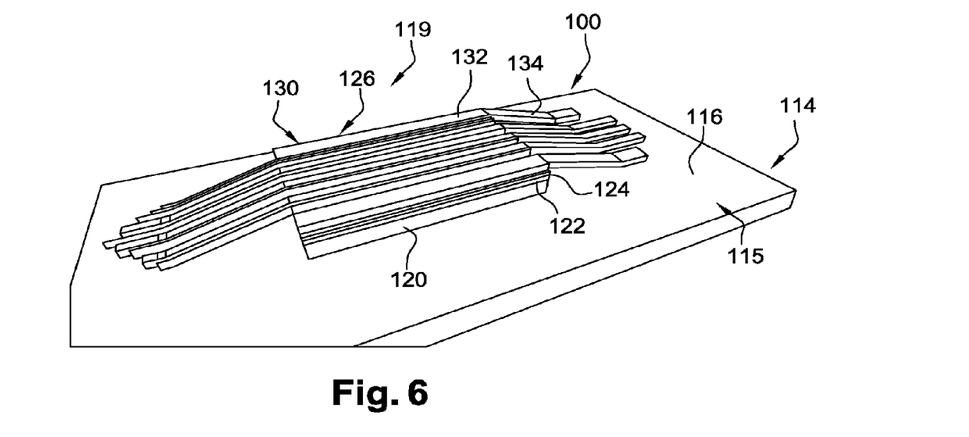
FIGS. 6 and 7 diagrammatically show a second embodiment of an electronic power device according to this invention.

FIG. 6 shows a second embodiment of the device 100.

Unlike the first embodiment described above in which the electrical interconnection structure 126 is placed in contact with the front face 115 of the layer 116 of the support 114, the electronic module 119 in this case is transferred onto the support 114 such that the substrate 120 is located in contact with the front face 115 of the layer 116, in other words such that the active face 124 is located between the support 114 and the electrical interconnection structure 126.

In this case, each of the electrically conducting portions 130 of the structure 126 comprises a first part 132 located in contact with the front face of the active layer 124, in other words in contact with the front face of the lateral electronic power components, and that extends in a plane approximately parallel to the active layer 124, and one or several second parts 134 that extend adjacent to the active layer 124 and that electrically connect the first part 132 to one or several electrically conducting tracks 118 (not shown on FIG. 6).

Unlike the first parts 132 of the portions 130 that form rectangular parallelepipeds approximately parallel to each other and form a flat structure approximately parallel to the active layer 124, the second parts 134 of the portions 130 do not form a flat conducting structure. For example, these second parts 134 are obtained by bending the parts of the portions 130 that are not adjacent to the active layer 124.

In this second embodiment, heat generated by the lateral electronic power components at the front face of the active layer 124 is removed from the side of the electrical interconnection structure 126 and is decoupled from the electrical signals that are routed in the conducting tracks 118 due to the fact that this heat removal takes place through the side of the face of the module 119 opposite to the side onto which the support 114 is located in which the electrical signals circulate.

Figure 7:
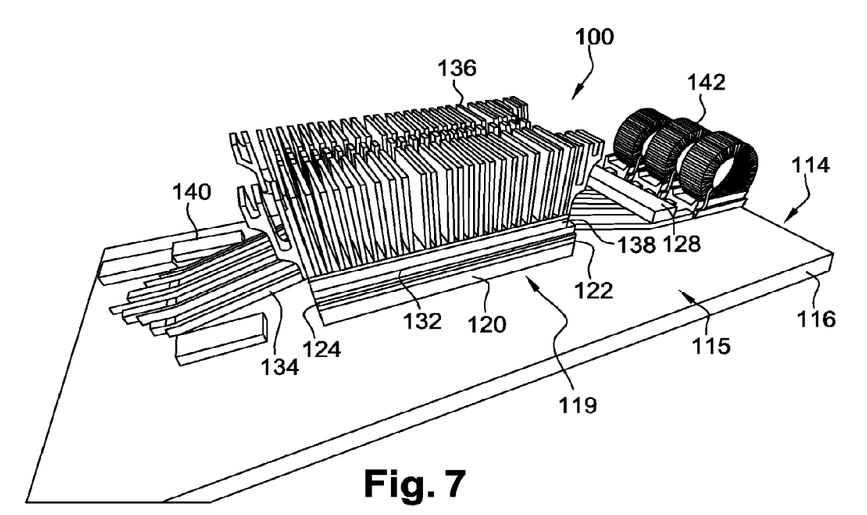

As shown on FIG. 7, the flat structure formed by the first parts 132 of the portions 130 makes it possible to secure a heat sink 136 (of the finned heat sink type shown on FIG. 7) onto the structure 126. Thus, heat is evacuated through the structure 126 and the heat sink 136. A dielectric layer 138 is interposed between the heat sink 136 and the structure 126 to prevent short circuits between the different conducting portions 130 of the structure 126 and also to isolate the heat sink 136 from high electrical potentials circulating in the structure 126. For example, this dielectric layer 138 correspond to a ceramic layer of a DBC substrate or any other dielectric layer for which the material advantageously has high thermal conductivity (for example such as AlN, kapton, etc.) to optimise cooling of lateral electronic power components from their active face.

The device 100 shown on FIG. 7 also has other elements: a decoupling capacitor 128 located on the second parts 134 of portions 130, a control circuit 140 located on the support 114 and filter inductances 142 for output signals from the device 100.

As a variant, the capacitor 128 could be located adjacent to the second parts 134 of the portions 130 instead of being on them.

For making the device 100 according to the second embodiment, the lateral electronic power components are made firstly in the active layer 124 that is mechanically supported by the substrate 120. The layers 124, 122 and 120 are then cut out, and then one or several of the stacks obtained is/are transferred to the front face 115 of the layer 116 of the support 114. The conducting portions 130 are then secured and connected to component electrodes, and the electrical connections between the tracks 118 and the second parts 134 of the portions 130 are formed by bending these second parts 134 of the portions 130, and electrically connecting them to the tracks 118. The dielectric layer 138 and the heat sink 136 are then transferred onto the first parts 132 of the portions 130 of the structure 126. The capacitor(s) 128 is (are) then secured and connected to portions 130 at the second parts 134 of the portions 130. Other elements such as the control circuit 140 and the filter inductances 142 are transferred onto the support 114.

As a variant to the first embodiment described above, a heat sink that could for example be similar to the heat sink 136 can be located under the support 114, with a dielectric layer being inserted between this heat sink and the support 114.

According to one variant of the second embodiment, a first metallic layer 144 can be interposed between the support 114 and the substrate 120, onto which one of the electrical power supply potentials will be applied, for example the first electrical power supply potential (DC-, in other words the ground in the example described herein), and a first dielectric layer 146 forming electrical insulation between the support 114 and the first metallic layer 144. Such metallic layer 144 forms a first electrostatic screen limiting parasite common mode capacitances that can be important due to the proximity of electrical output potentials of the device 100 outputted into the structure 126 with the support 114.

Similarly, a second electrostatic screen can be made by inserting a second metallic layer 148 onto which one of the electrical power supply potentials is applied, for example the second electrical power supply potential (DC+), and a second dielectric layer 150 between the structure 126 and the heat sink 136.

Figure 8:
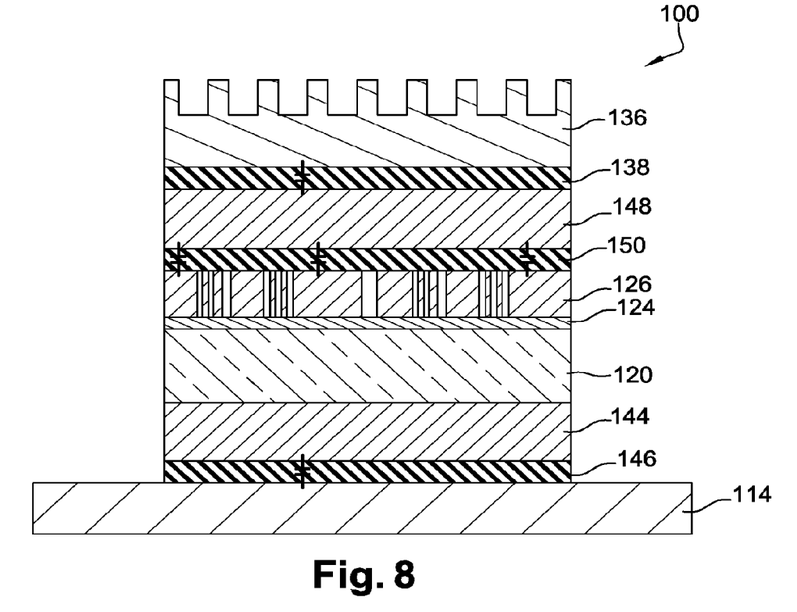
FIG. 8 shows a sectional view of a first variant of the second embodiment of an electronic power device according to this invention.

FIG. 8 is a sectional view of the device 100 comprising two electrostatic screens. These electrostatic screens form equipotentials that perform a shielding role preventing the appearance of a parasite capacitance with the heat sink 136 and the support 114.

When the device 100 according to the first embodiment comprises a heat sink located on the substrate 120, the layers 148 and 150 can be inserted between this heat sink and the substrate 120.

One of the electrical power supply potentials is applied to the first metallic layer 144 by forming an electrical connection between the first metallic layer 144 and the conducting portion 130 of the structure 126 in which this electrical potential circulates, for example via the creation of this electrical connection outside the module 119 or by making a conducting via that passes through the substrate 120 and the active layer 124. Similarly, the other electrical power supply potential is applied to the second metallic layer 148 by forming an electrical connection between the second metallic layer 148 and the conducting portion of the structure 126 in which this other electrical potential circulates, for example by creating a conducting via that passes through the dielectric layer 150.

In the two embodiments described above, the substrate 120 is kept in the module 119, either with or without the presence of one or two electrostatic screens.

As a variant, it is possible that the substrate 120 can be eliminated. In the first embodiment, this elimination of the substrate 120 can be done before or after the module 119 is transferred onto the support 114, the electrical interconnection structure 126 mechanically retaining the lateral electronic power components made in the active layer 124. In the second embodiment, the substrate 120 is eliminated before the module 119 is transferred onto the support 114, and an additional dielectric layer is then interposed between the active layer 124 and the support 114.

Figure 9:
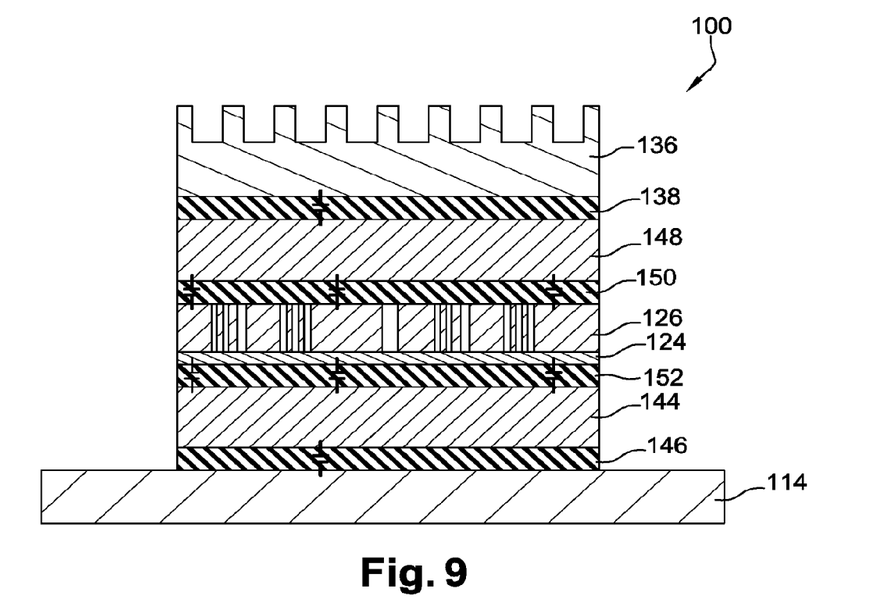
FIG. 9 shows a sectional view of a second variant of the second embodiment of an electronic power device according to this invention.

FIG. 9 shows a sectional view of the device 100 according to the second embodiment comprising the two electrostatic screens formed by the metallic layers 144 and 148 and in which the semiconducting substrate 120 that was initially used to make the lateral electronic power components is eliminated. In this configuration, the active layer 124 is electrically isolated from the metallic layer 148 by the additional dielectric layer 152.

Figure 10:
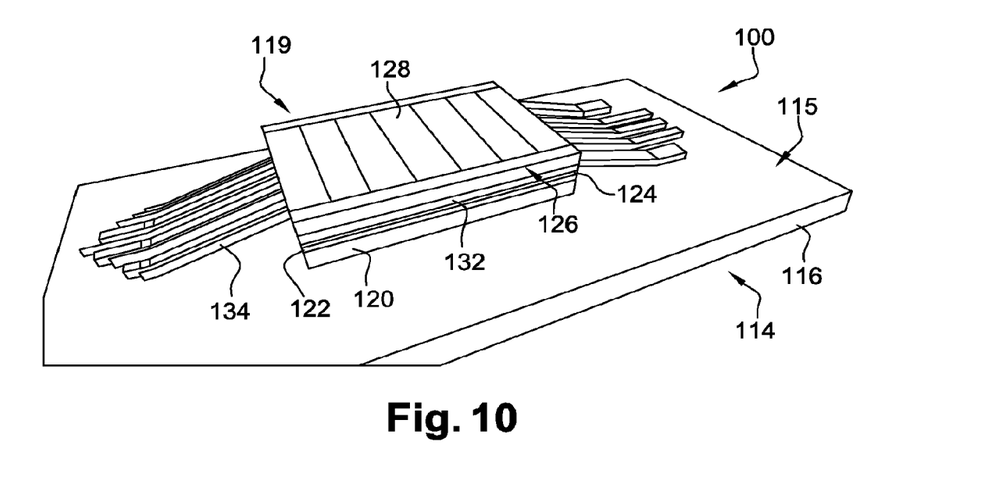
FIGS. 10 and 11 diagrammatically show a variant of the second embodiment of an electronic power device according to this invention.

FIG. 10 shows a variant of the second embodiment of the device 100.

In this variant, the decoupling capacitors 128 are located on the inverter, on the first parts 132 of the portions 130 of the structure 126. Thus, the capacitors 128 are located as close to the inverter as possible, thus providing optimum decoupling. On the other hand, with this variant the capacitors 128 are very close to the active areas of the electronic power components of the device 100 and therefore their temperature is the same as the operating temperature of these components.

Figure 11:
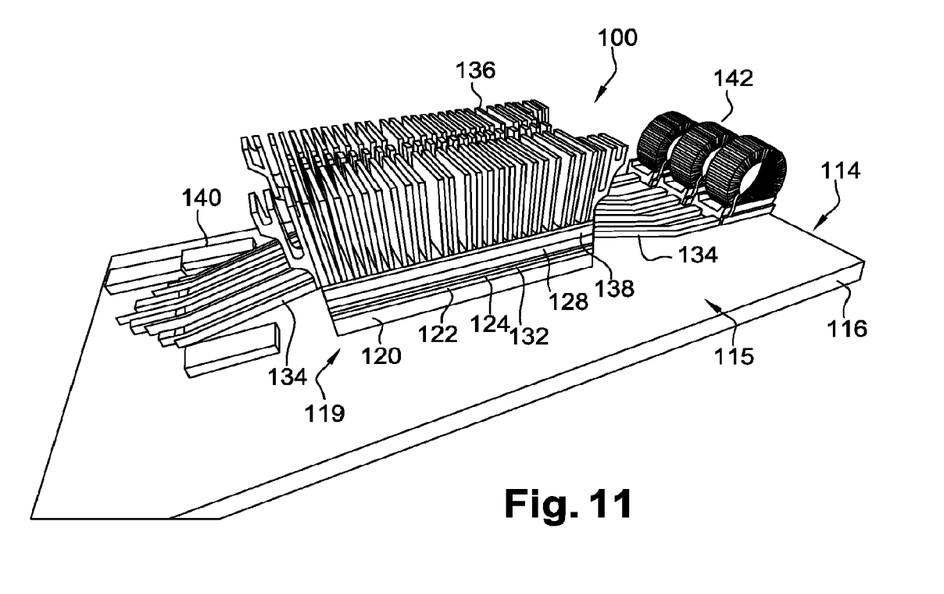

FIG. 11 shows the device 100 obtained according to this variant of the second embodiment when the heat sink 136 is located on the capacitors 128. As before, the dielectric layer 138 is interposed between the heat sink 136 and the capacitors 128. Therefore in this case the capacitors 128 form an additional layer located between the heat sink 136 and the portions 130 of the electrical interconnection structure 126, increasing the thermal resistance between the active area of the electronic power components and ambient air. The control circuit 140 and the filter inductances 142 of output signals of the device 100 are also located on the support 114.

The invention claimed is:

1. An electronic power device comprising at least:
    an active layer comprising at least one semiconductor and in which several lateral and/or semi-lateral electronic power components are made, all electrodes of the electronic power components being located on a front face of the active layer;
    an electrical interconnection structure comprising several electrically conducting portions secured to the front face of the active layer, to which the electrodes of the electronic power components are electrically connected, and of which at least first parts placed in contact with the electrodes of the electronic power components extend in a plane approximately parallel to the active layer; and
    a support comprising a front face on which electrically conducting tracks are located, wherein
    the active layer and the electrical interconnection structure are secured to the front face of the support such that:
        the electrical interconnection structure is located between the active layer and the support, the first parts of the electrically conducting portions being placed in contact with the electrically conducting tracks, or
        the active layer is located between the electrical interconnection structure and the support, the electrically conducting portions also comprising second parts extending next to the active layer and electrically connecting the first parts of the electrically conducting portions to the electrically conducting tracks.

2. The electronic power device according to claim 1, wherein a thickness of the electrically conducting portions is between about 50 µm and 1000 µm.

3. The electronic power device according to claim 1, wherein at least the first parts of the electrically conducting portions form rectangular parallelepipeds.

4. The electronic power device according to claim 1, wherein the electrodes of the electronic power components are flat.

5. The electronic power device according to claim 1, further comprising at least one heat sink when the active layer is located between the electrical interconnection structure and the support, located on the electrical interconnection structure such that the electrical interconnection structure is located between the at least one heat sink and the active layer.

6. The electronic power device according to claim 1, further comprising at least one decoupling capacitor such that:
    when the electrical interconnection structure is located between the active layer and the support, said at least one decoupling capacitor is placed on a part of the electrically conducting tracks and is electrically connected to the electrically conducting tracks, or
    when the active layer is located between the electrical interconnection structure and the support, said at least one decoupling capacitor is placed on the second parts of the electrically conducting portions and is electrically connected to the second parts of the electrically conducting portions, or is placed on the first parts of the electrically conducting portions.

7. The electronic power device according to claim 5, wherein the active layer is located between the electrical interconnection structure and the support, the electronic power device comprising at least one decoupling capacitor placed on the first parts of the electrically conducting portions, and the at least one heat sink is located on said at least one decoupling capacitor.

8. The electronic power device according to claim 1, further comprising, when the active layer is located between the electric interconnection structure and the support, at least one first metallic layer located between the support and the active layer and onto which a first electrical power supply potential of the electronic power device is to be applied.

9. The electronic power device according to claim 5, further comprising at least one second metallic layer located between the at least one heat sink and the electrical interconnection structure and onto which a second electrical power supply potential of the electronic power device is to be applied.

10. The electronic power device according to claim 1, wherein:
the active layer comprises at least one of the following materials: GaN, AlGaN and AlN, and/or the electronic power components comprise HEMT type transistors, or
the active layer comprises at least silicon, and/or the electronic power components comprise at least one of the following types of transistors: MOS, JFET, IGBT, BJT, DMOS.

11. The electronic power device according to claim 1, wherein at least some of the electronic power components form at least one switching cell, and/or in which the electronic power device comprises at least one static converter comprising several switching cells electrically connected to each other.

12. The electronic power device according to claim 1, wherein the electronic power components are located on at least one semiconducting substrate such that:
when the electrical interconnection structure is located between the active layer and the support, the active layer is located between the semiconducting substrate and the electrical interconnection structure, or
when the active layer is located between the electrical interconnection structure and the support, the semiconducting substrate is located between the active layer and the support.

13. A method of making an electronic power device comprising at least:
making several lateral and/or semi-lateral electronic power components in at least one active layer comprising at least one semiconductor such that all electrodes of the electronic power components are located on a front face of the active layer;
attaching the front face of the active layer to an electrical interconnection structure comprising several electrically conducting portions to which the electrodes of the electronic power components are electrically connected, and of which at least first parts located in contact with the electrodes of the electronic power components extend in a plane approximately parallel to the active layer; and
attaching the active layer and the electrical interconnection structure to a front face of a support on which electrically conducting tracks extend, such that:
the electrical interconnection structure is located between the active layer and the support, the first parts of the electrically conducting portions being placed in contact with the electrically conducting tracks, or
the active layer is located between the electrical interconnection structure and the support, the electrically conducting portions comprising second parts extending next to the active layer and electrically connecting the first parts of the electrically conducting portions to the electrically conducting tracks.

14. The method according to claim 13, wherein when the electrical interconnection structure is located between the active layer and the support:
the making makes the electronic power components collectively in the active layer that is located on a semiconducting substrate, and
the attaching of the front face of the active layer to the electrical interconnection structure corresponds to an attachment of the front face of the active layer to a structured metallic layer that is to form the electrical interconnection structure.

15. The method according to claim 14, further comprising eliminating the semiconducting substrate, between the attachment of the front face of the active layer to the structured metallic layer and the attachment of the active layer and the electrical interconnection structure to the front face of the support.

16. The method according to claim 14, further comprising cutting out at least the active layer and the structured metallic layer, between the attachment of the front face of the active layer to the structured metallic layer and the attachment of the active layer and the electrical interconnection structure to the front face of the support, forming a stack that is then transferred onto the front face of the support.

17. The method according to claim 13, wherein, when the active layer is located between the electrical interconnection structure and the support:
the making makes the electronic power components collectively in the active layer that is located on a semiconducting substrate,
the active layer is secured to the front face of the support before the attaching of the electrical interconnection structure to the front face of the active layer,
and the method further comprising cutting out the semiconducting substrate and the active layer, between the making of the electronic power components and the attachment of the active layer to the front face of the support, forming a stack that is then transferred onto the front face of the support.

* * * * *